(12) United States Patent
Björneklett

(10) Patent No.: US 6,411,113 B1
(45) Date of Patent: Jun. 25, 2002

(54) RADIO FREQUENCY TEST FIXTURE

(75) Inventor: Are Björneklett, Västeras (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 36 days.

(21) Appl. No.: 09/711,079

(22) Filed: Nov. 14, 2000

(30) Foreign Application Priority Data

Nov. 19, 1999 (SE) ................................. 9904184

(51) Int. Cl.[7] ................................. G01R 31/26
(52) U.S. Cl. ................. 324/754; 324/765; 324/761
(58) Field of Search ........................ 324/754, 755, 324/765, 761; 439/66, 67, 68, 70; 438/14, 18; 257/48, 532, 533; 333/22 R, 172

(56) References Cited

U.S. PATENT DOCUMENTS

| 5,500,605 | A |  | 3/1996 | Chang |  |
|---|---|---|---|---|---|
| 5,532,983 | A |  | 7/1996 | Madrid et al. |  |
| 5,859,538 | A |  | 1/1999 | Self |  |
| 5,955,888 | A |  | 9/1999 | Frederickson et al. |  |
| 6,218,729 | B1 | * | 4/2001 | Zavrel, Jr. et al. | ........... 257/532 |
| 6,246,011 | B1 | * | 6/2001 | Abraham et al. | ........... 174/260 |

* cited by examiner

*Primary Examiner*—Vinh P. Nguyen
(74) *Attorney, Agent, or Firm*—Nixon & Vanderhye P.C.

(57) ABSTRACT

A radio frequency test fixture for testing a BGA module (1) comprises a number of standard spring loaded probes in sleeves (5, 6, 7), to be brought into contact with the solder balls (2, 3, 4) of the module (1). The sleeves (5, 6, 7) are fixed between two printed circuit boards (8, 9) with their ends flush with the outward-facing surfaces of the printed circuit boards (8, 9). Both ends of sleeves (5, 7) with probes for contacting solder balls (2, 3) connected to module ground, are connected to ground planes (10, 11) on the respective printed circuit board (8, 9). At least one electrically conducting impedance matching element (12–15) connected at its ends to the ground planes (10, 11) on the respective printed circuit board (8, 9) extends adjacent to and in parallel with each sleeve (6) with a probe for contacting a solder ball (3) connected to an RF I/O terminal on the module (1).

4 Claims, 1 Drawing Sheet

RADIO FREQUENCY TEST FIXTURE

TECHNICAL FIELD

The invention relates generally to test fixtures, and more specifically to a radio frequency test fixture for testing ball grid array modules.

BACKGROUND OF THE INVENTION

In combined transmitter and receiver ball grid array (BGA) modules, i.e. BGA radio modules, comprising a radio frequency (RF) input/output (I/O) terminal, that I/O terminal is normally connected directly to an antenna via a corresponding solder ball. Thus, both transmitted and received RF signals are propagated through this terminal.

To keep the cost of BGA modules as low as possible, such RF I/O terminals should not differ from the other terminals of the modules such as digital control signal terminals and voltage supply terminals.

Although the RF or antenna terminals do not differ physically from the other I/O terminals, it is extremely important to ensure proper electrical impedance of such terminals. If the impedance requirements are not met, the transmitted radio signals will be weaker, and the sensitivity of the receiver will be reduced. Proper electrical impedance is a module design criterion.

The impedance of the antenna connection is equally important. A user of the radio module has to design the connection between the module and the antenna such that the electrical impedance is matched to the module.

This issue imposes a problem associated with test and measurement of the module in that the module, during testing, has to be connected to the test system via an interconnect system having proper impedance.

SUMMARY OF THE INVENTION

The object of the invention is to bring about a RF test fixture for testing BGA radio modules ensuring proper impedance matching between the modules and the test system.

This is attained by means of the RF test fixture in accordance with the invention in that it comprises a number of standard spring-loaded probes in sleeves fixed between two printed circuit boards in such a manner that the ends of the sleeves are flush with the respective outward-facing surface of the printed circuit boards, the ends of the sleeves with a probe for contacting a solder ball connected to module ground being grounded, and at least one electrically conducting impedance-matching element extending between the printed circuit boards adjacent to and in parallel with a sleeve with a probe for contacting a solder ball connected to an RF I/O terminal on the module for impedance matching purposes. The ends of each such impedance-matching element being grounded.

Hereby, proper impedance matching can be obtained between the BGA module and the test system.

BRIEF DESCRIPTION OF THE DRAWING

The invention will be described more in detail below with reference to the appended drawing, on which

DESCRIPTION OF THE INVENTION

Figure 1:
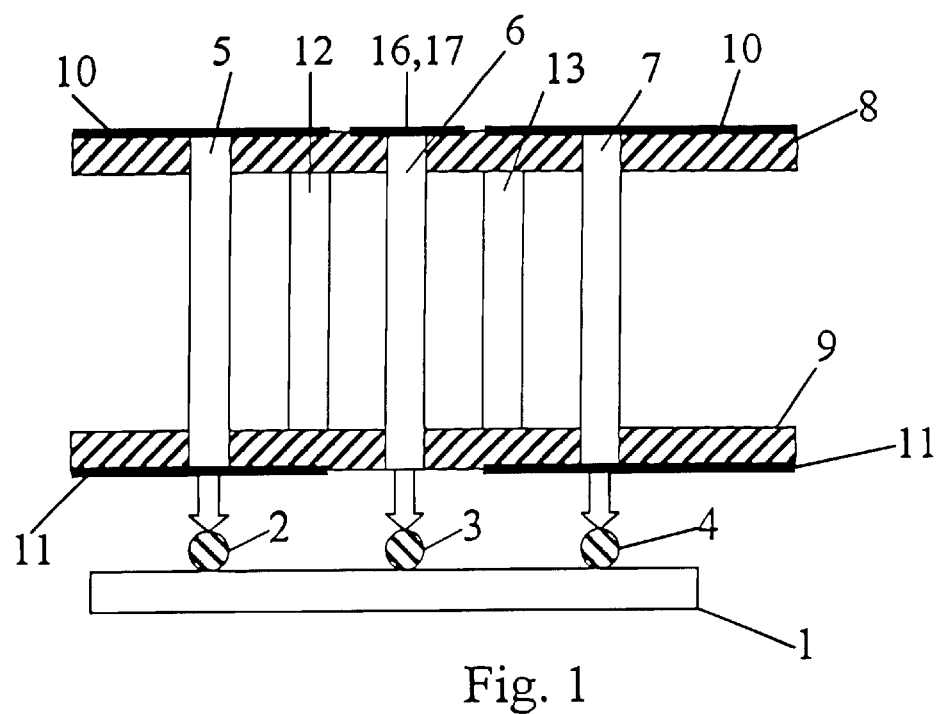
FIG. 1 is a schematic horizontal partial view of an embodiment of a test fixture according to the invention, for testing a schematically illustrated BGA module.

FIG. 1 is a schematic horizontal partial view of a BGA module 1 having a number of solder balls along its edges, of which just three solder balls 2, 3, 4 are shown in FIG. 1.

In this connection, it should be pointed out that there can be several rows of solder balls along the edges of BGA modules. Moreover, the solder balls do not necessarily have to be located just along the edges of BGA modules, but there can be solder balls in e.g. grid patterns on the modules.

The BGA module 1 is supposed to be a radio module, i.e. a combined transmitter and receiver module, and is supposed to have one RF I/O terminal which is to be connected directly to an antenna (not shown) via its corresponding solder ball.

In the embodiment illustrated in FIG. 1, the solder ball 3 is supposed to be connected to the RF I/O terminal of the module 1.

The solder balls 2 and 4 of the embodiment shown in FIG. 1 are supposed to be connected to module ground terminals (not shown) on the module 1.

In this connection, it should be pointed out that there can be more than one solder ball connected to a corresponding RF I/O terminal on the module 1 in some applications.

To test the BGA module 1, an RF test fixture in accordance with the invention, is to be used.

The test fixture according to the invention comprises a number of standard spring-loaded probes in sleeves of the type for testing printed circuit boards, e.g. of type SPR-OW, manufactured by Everett Charles Technologies. The probes are to be brought into contact with the respective solder ball on the module 1 with their respective probe heads.

In the embodiment in FIG. 1, three such spring-loaded probes in sleeves denoted 5, 6 and 7, are shown with their probe heads in contact with the solder balls 2, 3 and 4, respectively, on the module 1.

In accordance with the invention, the sleeves 5, 6, 7 with the probes are fixed between two printed circuit boards 8 and 9 in such a manner that the ends of the sleeves 5, 6, 7 are flush with the respective outward-facing surface of the printed circuit boards 8, 9.

As mentioned above, the solder balls 2 and 4 are supposed to be connected to module ground on the module 1.

In accordance with the invention, both ends of the sleeves 5 and 7 with probes for contacting the solder balls 2 and 4 are connected to ground planes 10 and 11 on the respective printed circuit board 8 and 9.

In the embodiment of the module 1 shown in FIG. 1, the centre-to-centre distance between the solder balls, i.e. the pitch, is supposed to be 1.27 mm.

The impedance of the test system (not shown) located on top of the printed circuit board 8 is supposed to be 50 Ω.

To ensure that the characteristic impedance of the signal path through the probe fixture, i.e. through the probe in the sleeve 6 in contact with the solder ball 3 connected to the RF I/O terminal of the module 1, is the same as the impedance of the test system, electrically conducting impedance-matching elements have to be arranged adjacent to and in parallel with the sleeve 6 in accordance with the invention.

Figure 2:
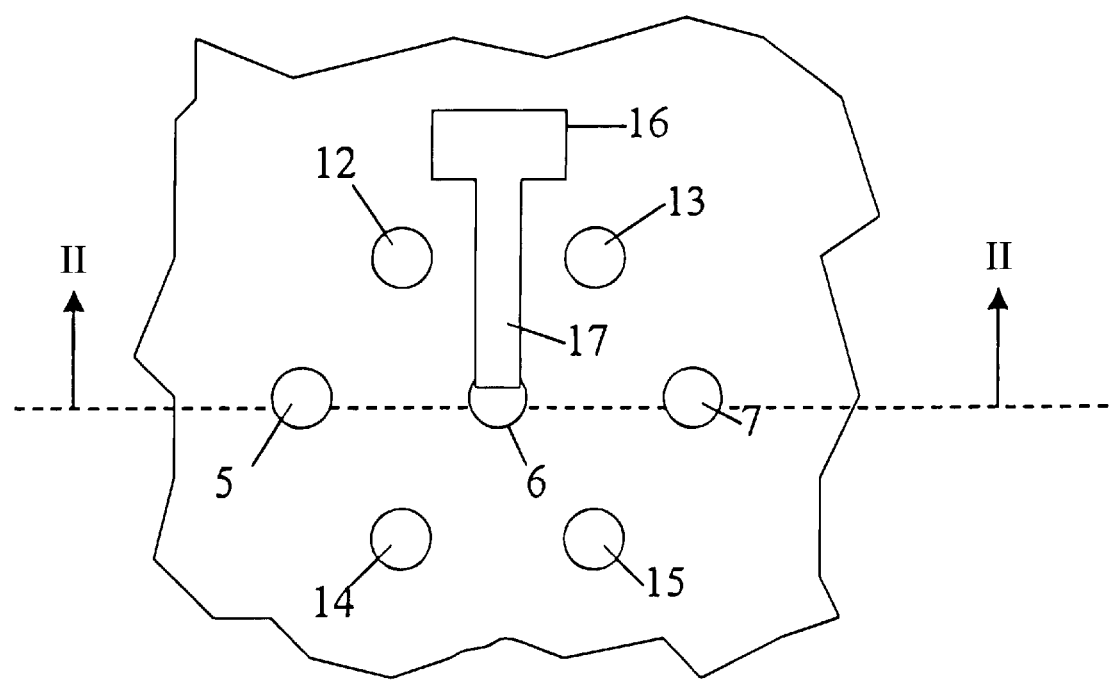
FIG. 2 is a schematic vertical view of the test fixture in FIG. 1.

In FIG. 2, which is a vertical view of the test fixture in FIG. 1 without the ground plane 10, four such impedance-matching elements 12, 13, 14 and 15 are shown. The impedance-matching elements are preferably located at the same distance from the sleeve 6 as the sleeves 5 and 7.

In FIG. 1, which is a sectional view along the line A—A in FIG. 2, only the impedance-matching elements 12 and 13 are visible.

In accordance with the invention, the impedance-matching elements 12, 13, 14 and 15 can be standard sleeves without probes of the same type as the sleeves 5, 6 and 7 with probes. As impedance-matching elements, pieces of a wire of an electrically conducting metal, e.g. copper, can also be used.

In accordance with the invention, the impedance-matching elements 12, 13, 14 and 15 are connected at their ends to the ground planes 10, 11 on the respective printed circuit board 8, 9.

The characteristic impedance Z of the signal path through the sleeve 6 with its probe equals $$\sqrt{\frac{L}{C}},$$

L being the electrical inductance per unit length, and C being the electrical capacitance per unit length with respect to ground.

If the sleeve 6 with the RF signal probe is of a diameter r, and if there are n grounded sleeves such as sleeves 5, 7, 12–15 in FIG. 1, also of a diameter r, arranged around the sleeve 6 at a centre-to-centre distance R between the sleeve 6 and the grounded sleeves, $$L = \frac{\mu}{2\pi} \cdot \ln\left[\frac{2R}{r}\right] \text{ and } C = n \cdot \frac{2\pi\varepsilon}{\ln\left[\frac{2R}{r}\right]},$$

where $\mu$ is the permeability of the media surrounding the probes, normally air, and e is the permittivity of the media surrounding the probes, also normally air.

It should be pointed out that the equations for L and C above are merely approximations. For best results, an electromagnetic simulation with dedicated computer software should preferably be used.

Also in accordance with the invention, the end of the sleeve 6 with the probe for contacting the solder ball 3 connected to the RF I/O terminal of the module 1, that faces away from the probe head, is connected to a pad 16 on the printed circuit board 8 via a strip-line conductor 17 as best illustrated in FIG. 2.

As should be apparent from the above, proper impedance matching will be attained by means of the arrangement according to the invention.

What is claimed is:

1. A radio frequency test fixture for testing a ball grid array module comprising:

a number of solder balls, at least one of the solder balls being connected to a radio frequency input/output terminal of the module, and at least one of the solder balls being connected to module ground;

a number of standard spring loaded probes in sleeves, to be brought into contact with the respective solder ball of the module, wherein the sleeves with the probes are fixed between two printed circuit boards in such a manner that the ends of the sleeves are flush with the respective outward-facing surface of the printed circuit boards, wherein both ends of sleeves with probes for contacting said at least one solder ball connected to module ground, are connected to ground planes on the respective printed circuit board, and wherein at least one electrically conducting impedance matching element extends between the printed circuit boards adjacent to and in parallel with each sleeve with a probe for contacting a solder ball connected to a radio frequency input/output terminal on the module to match a characteristic impedance of a signal path through said probe for contacting a solder ball connected to a radio frequency input/output terminal to a characteristic impedance of a test system, said at least one impedance matching element being connected at its ends to the ground plane on the respective printed circuit board.

2. The test fixture as claimed in claim 1, wherein said at least one impedance matching element is a standard sleeve without probe.

3. The test fixture as claimed in claim 1, wherein said at least one impedance matching element is a piece of wire.

4. The test fixture as claimed in claim 1, wherein the end of each sleeve with a probe for contacting a solder ball connected to a radio frequency input/output terminal, that faces away from the probe, is connected to a pad on the corresponding printed circuit board via a strip line conductor.

* * * * *